United States Patent [19]

Tanabe et al.

[11] Patent Number: 5,139,372
[45] Date of Patent: Aug. 18, 1992

[54] POLYCRYSTALLINE DIAMOND TOOL AND METHOD FOR PRODUCING THE POLYCRYSTALLINE DIAMOND TOOL

[75] Inventors: Keiichiro Tanabe; Naoji Fujimori, both of Hyogo, Japan

[73] Assignee: Sumotomo Electric Industries, Ltd., Osaka, Japan

[21] Appl. No.: 678,210

[22] Filed: Apr. 1, 1991

[30] Foreign Application Priority Data

Mar. 30, 1990 [JP] Japan ................................. 2-86044
May 17, 1990 [JP] Japan ................................. 2-128564

[51] Int. Cl.$^5$ ....................... B23B 27/20; B23B 27/18
[52] U.S. Cl. ..................................... 407/118; 51/295; 175/420.2; 407/119; 408/145
[58] Field of Search .................. 51/293, 295, 307, 308, 51/309; 407/118, 119; 408/144, 145; 175/329, 330

[56] References Cited

U.S. PATENT DOCUMENTS 4,311,490 1/1982 Bovenkerk et al. ............. 51/293 X
4,604,106 8/1986 Hall et al. ............................. 51/293

FOREIGN PATENT DOCUMENTS 58-91100 5/1983 Japan .
1-153228 6/1989 Japan .

*Primary Examiner*—Steven C. Bishop
*Attorney, Agent, or Firm*—Cushman, Darby & Cushman

[57] ABSTRACT

Polycrystalline diamond has non-uniform quality along the direction of thickness. The diamond near the rake surface is of better quality. The diamond near the fixation surface is of worse quality. The worse diamond near the fixation surface alleviates a strong stress or absorbs an external shock. Owing to the worse diamond near the fixation surface, the diamond tool excels in chip resistance or toughness. The better diamond near the rake surface heightens abrasion resistance, adhesion resistance and strength.

15 Claims, 7 Drawing Sheets rake surface
tool body
diamond plate
fixation surface

POLYCRYSTALLINE DIAMOND TOOL AND METHOD FOR PRODUCING THE POLYCRYSTALLINE DIAMOND TOOL

FIELD OF THE INVENTION

This invention relates to a polycrystalline diamond tool which excels in strength, abrasion resistance, chip resistance, adhesion resistance and heat resistance and is suitable for cutting tools or abrasion resistance tools.

BACKGROUND OF THE INVENTION

All polycrystalline diamonds for tools have hitherto been produced by the sintering method. Namely, diamond powder—polycrystalline diamond granules—is charged in a mold, is put under high pressure, is heated to a high temperature and is kept for a certain time at the high temperature under high pressure. Diamond granules are coupled together by the action of the heat and the pressure. Thus powder is integrated into a body. The shape of the sintered body is determined by the mold. Sintered diamond has been used on cutting devices for nonferrous metals, drill bits and drawing dies.

For example, the Japanese Patent Publication No. 52-12126 disclosed a sintered body of diamond including cobalt by about 10 to 15 volume percent which was made by sintering diamond powder being kept in contact with the cemented carbide of group WC-Co (tungsten carbide-cobalt), diffusing some part of cobalt into the diamond powder as a binder metal. The sintered diamond body including cobalt as solid solution is gifted with a practical utility for cutting tools for nonferrous metals. In general, since diamond has the tendency to be alloyed with iron or steel, diamond tool is not used on cutting ferrous metals.

However, the sintered diamond has a drawback of the poor heat resistance. The abrasion resistance and the strength of the sintered body of diamond are greatly lowered by being heated above 700° C. The sintered body of diamond is destroyed by being heated above 900° C.

Single crystal diamond or polycrystalline diamond has high heat resistance. Why is the heat resistance of the sintered diamond so poor? One reason is that diamond is partly converted to graphite on the boundary between the diamond granules and the cobalt solid solution at high temperature. Conversion of diamond into graphite lowers the strength and the abrasive resistance, because graphite is weaker than diamond in strength. Another reason is that the difference of the thermal expansion between cobalt and diamond generates strong thermal tension at the boundary between the diamond granules and the cobalt solid solution.

To improve the poor heat resistance of the sintered body of diamond, the Japanese Patent Laying Open No. 53-114589 proposed a sintered body of diamond which is rid of cobalt as a binder metal by treating the sintered diamond body with acid. The sintered diamond body must be immune from the problems of the graphite conversion and the thermal tension which would occur at the boundary of the diamond granules and the cobalt solid solution, since the sintered body includes no cobalt. However, the sintered diamond body without cobalt becomes severely porous, because the spaces where cobalt has occupied are left as holes after cobalt is dissolved away by acid. Although the heat resistance is raised by washing cobalt away, the mechanical strength of the sintered body is lowered because of the porosity. The diamonds produced by the sintering method are accompanied by these drawbacks. The sintering method at present cannot satisfy the requirements of both mechanical strength and heat resistance.

Recently, a new technology which enables us to synthesize diamond polycrystals chemically from vapor phase has been developed. This technology is called a chemical vapor phase deposition (CVD) method or simply a vapor phase synthesis. The method comprises the steps of diluting hydrocarbon gas of less than 5 volume percent with hydrogen gas, introducing the mixture gas into a reactor under the pressure of several tens Torr (several thousands Pa), exciting the material gas for resolving it to an active state by some means and depositing diamond on the substrate heated at a certain temperature. With regard to the means for exciting the material gas, various means have been proposed, e.g. heating by filament heater or exciting the material gas by electrons or plasma. Some different CVD methods have been proposed according to the means for excitation.

The Japanese Patent Laying Open No. 58-91100 ('83) proposed a method comprising the steps of preheating the material gas by a hot electron emission material heated above 1000° C., introducing the preheated material gas onto a heated substrate, resolving hydrocarbon to active states, e.g. ions, electrons and neutral radicals and depositing a diamond polycrystal on the substrate.

The Japanese Patent Laying Open No. 58-110494 ('83) proposed a method comprising the steps of exciting hydrogen gas into plasma by the microwave electrodeless discharge, mixing the plasma-excited hydrogen with hydrocarbon gas and depositing a diamond polycrystal on a heated substrate.

Thus, there are various kinds of the CVD methods for growing diamond crystals according to the means for excitation.

Diamond polycrystals are grown by the CVD methods. There are two ways for applying the diamond polycrystals to tools. One is separating the diamond polycrystal from the substrate and fitting the diamond polycrystal to an end of a tool. The other is depositing the diamond polycrystal directly on an edge of a tool instead of a substrate. The edge of the tool is reinforced by the diamond coating.

Japanese Patent Laying Open No. 1-153228 ('89) and the Japanese Patent Laying Open No. 1-210201 ('89) proposed a method for producing a diamond tool comprising the steps of depositing a diamond polycrystal on a substrate by a chemical vapor deposition (CVD) method, etching the substrate away with acid or other pertinent solution and fitting the separated diamond polycrystal to an edge of a tool which is made of metal. However, the diamond tool consisting of a diamond edge and a metal body lacks chip resistance and abrasion resistance. The "chip resistance" is here defined as the strength for keeping its shape against an external shock without being cracked away. Low chip resistance means being likely to be cracked by an external shock. The "abrasion resistance" is here defined as the strength against abrasion. Low abrasion resistance means being likely to be abraded easily. Intrinsically diamond should have high abrasion resistance and high chip resistance, but the diamond crystal synthesized by the present CVD methods is not endowed with the high abrasion resistance and high chip resistance by some unknown reasons.

The tools whose edge is coated with polycrystalline diamond have also been proposed. On whole of a tool or on a part of a tool as a substrate, diamond polycrystal is grown by the CVD method. Since the edge of the tool is coated with diamond, the edge would have enough strength. However, the CVD coated tools in practice show poor performance—weak strength, low chip resistance and low abrasion resistance. The reason of the poor performance is partly because the diamond polycrystal is too thin, partly because the adhesion force between the diamond and the tool metal is insufficient and partly because the diamond is likely to peel off from the metal surface. However, it is difficult to heighten the adhesion strength, since the tool metal and the diamond are totally different with regard to many physical or chemical properties, e.g. crystal structure, conductivity, thermal expansion.

The Japanese Patent Laying Open No. 2-22471 ('90) proposed an improved CVD coated tool. The adhesion strength is heightened by coating a cemented carbide tool with an improved diamond compound. However, such a diamond coated tool often shows poor cutting performance dependent on the roughness of the object to be cut. Further, the cutting performance of the tool is totally insufficient, when it cuts the hard objects with high cutting resistance, e.g. Al-17% Si alloy (Al 83%, Si 17%), Al-25% Si alloy (Al 75%, Si 25%).

One purpose of the invention is to provide a polycrystalline diamond tool with high strength, high adhesion resistance, high heat resistance, and high abrasion resistance.

Another purpose of the invention is to provide a polycrystalline diamond tool which excels in chip resistance and abrasion resistance for cutting the hard objects with high cutting resistance.

Another purpose of the invention is to provide a method for producing a polycrystalline diamond with high strength, high adhesion resistance, high heat resistance and high abrasion resistance.

Another purpose of the invention is to provide a method for estimating the diamond polycrystal.

SUMMARY OF THE INVENTION

The polycrystalline diamond tool of this invention comprises a tool body with an end having an end surface and a diamond polycrystal plate for fitting on the end surface of the tool body. The diamond polycrystal plate is more than 40 $\mu$m in thickness. The crystalline property of the diamond plate changes along the direction vertical to the surfaces. The crystalline property near the rake surface is better than that near the fixation surface. The better crystalline property near the rake surface gives the diamond plate high strength, high abrasion resistance and high adhesion resistance. On the contrary, the worse crystalline property near the fixation surface heightens the chip resistance by alleviating the stress applied on the rake surface, since the worse crystalline property heightens the toughness because of the low rigidity owing to the numerous lattice defects.

Both the diamond near the rake surface and the diamond near the fixation surface cooperate to give the tool ideal characteristics by compensating the weak points of the counterparts with their strong points. Therefore, the essential feature of this invention depends on a complementary principle between the rake surface and the fixation surface.

The word "diamond" used herewith includes non-diamond ingredients besides pure diamond ingredient. Since the diamond is deposited by the CVD methods, non-diamond ingredients (amorphous carbon, crystalline carbon of non-diamond crystal structure, e.g. graphite) are deposited at the same time with the diamond deposition. A good diamond means such a diamond almost free from non-diamond ingredients. Furthermore, with regard to the crystalline property, a good diamond means a diamond with perfect crystalline structure almost without distortion or lattice defects.

A bad diamond means such a diamond having enormous non-diamond ingredients and many lattice defects with imperfect crystalline structure to the contrary.

While the CVD deposited diamond of the prior art has uniform property, the diamond of this invention has varying property in the direction of thickness (vertical to the plane): worse diamond near the fixation surface for being mounted on an edge of a tool and better diamond near the rake surface for cutting objects.

In this case, characteristic values are required for estimating the quality of diamond. There are two characteristic values pertinent for estimation. ① concentration of lattice defects (defect concentration) ② density of non-diamond ingredients (non-diamond density).

The non-diamond ingredients mean amorphous carbon, graphite, etc. Lattice defects mean crystalline defects in the diamond structure. Two values are of course different physical values but they are strongly related each other. For simplicity "the concentration of lattice defects" is expressed by "defects concentration", and "the density of non-diamond ingredients" is expressed by "non-diamond density".

Although this invention has been defined by the properties only of both surfaces of diamond so far, this invention can also be defined by the properties of partial regions with a certain depth from the rake surface and the fixation surface.

An easy method for fabricating a diamond plate with the properties varying in the direction of thickness is varying the quotient $Q=(B)/(A)$ during the deposition, where (A) is the amount of hydrogen gas and (B) is the amount of hydrocarbon gas in the material gas of the CVD method. The quality of diamond is lowered by increasing the quotient Q. Otherwise, the quality of diamond is also lowered by decreasing oxygen gas in the material gas. Furthermore, increasing nitrogen gas in the material gas also worsens the quality of diamond.

FUNCTIONS

FIG. 1 shows a simple example of a polycrystalline diamond tool. A tool body (1) is made from cemented carbide. A polycrystalline diamond plate (2) is fixed on an end of the tool body (1) by a brazing layer (3). The diamond plate (2) has two surfaces. The outer surface revealed outside is called a rake surface (4). The inner surface concealed by the tool body (1) is here called a fixation surface. In this invention, the crystalline quality is not uniform, but is changing along the direction vertical to the surface, namely along the direction of thickness. The crystalline property near the fixation surface is worse than that near the rake surface in this invention.

The diamond near the rake surface shall be grown by suppressing the inclusion of non-diamond ingredients as little as possible. On the contrary, the diamond near the fixation surface shall be grown with an certain inclusion of non-diamond ingredients more than that at the rake surface. Otherwise, the diamond near the rake surface shall be grown by suppressing the occurrence of lattice defects. The diamond near the fixation surface shall be grown with increasing lattice defects by intention.

In general, diamond with high non-diamond density has high defect concentration. However, there are two diamond films with the same non-diamond density which differ each other in the defect concentration. Therefore, the property of diamond should be defined by two physical values—by non-diamond density and by defect concentration, since two values are not always equivalent.

The diamond on or near the rake surface shall be synthesized as a diamond of better quality with lower non-diamond density or with lower defect concentration. The diamond on or near the fixation surface shall be synthesized as a diamond of worse quality with higher non-diamond density or with higher defect concentration.

Because of the higher non-diamond density and the higher defect concentration, the diamond in the vicinity of the fixation surface has low rigidity and enough elasticity. This is important. Enough elasticity or low rigidity can alleviate the strong stress applied on the rake surface by an object to be cut. Namely, the diamond on the fixation surface plays a role of a stress alleviation layer or shock absorber layer.

In the structure of the diamond plate, the rigidity is low near the fixation surface but the rake surface has high rigidity. The structure heightens the toughness of the diamond plate as a whole without lowering the rigidity of the rake surface. Because of the high rigidity of the rake surface, the diamond tool has high abrasion resistance. In other words, this invention enables the diamond tool to heighten the chip resistance without damaging the excellent abrasion resistance of diamond.

For defining the invention more strictly, the properties of the diamond will be now expressed by the three dimensional coordinate. The z-axis is defined as the direction vertical to the surface of the diamond. The x-axis and the y-axis are defined as two vertical directions both of which are parallel to the surface of the diamond. The non-diamond density at the point $(x, y, z)$ is represented by $W(x, y, z)$. The defect concentration at the point $(x, y, z)$ is represented by $D(x, y, z)$. The original point of the coordinate exists on the rake surface. Then $z=0$ means the rake surface. The thickness of the diamond plate is denoted by T. Thus $z=T$ means the fixation surface.

For defining the invention by the non-diamond density, the non-diamond densities $G_0$ and $H_0$ on the rake surface and on the fixation surface are defined by $$G_0 = \int W(x,y,O) dx\, dy / S \tag{1}$$

$$H_0 = \int W(x,y,T) dx\, dy / S \tag{2}$$

$$S = \int dx\, dy \tag{3}$$

where S is the area of the surface of the diamond. The first definition of the invention is expressed by the inequalities.

$$T > 40 \ \mu m \tag{4}$$

$$G_0 < H_0 \tag{5}$$

Otherwise for defining the invention by the defect concentration, the defect concentrations $U_0$ and $V_0$ on the rake surface and on the fixation surface are defined by $$U_0 = \int D(x,y,O) dx\, dy / S \tag{6}$$

$$V_0 = \int D(x,y,T) dx\, dy / S \tag{7}$$

$$S = \int dx\, dy \tag{8}$$

The second definition of the invention is expressed by the inequalities, $$T > 40 \ \mu m \tag{9}$$

$$U_0 < V_0 \tag{10}$$

However, the values of the non-diamond density or defect concentration are not restricted to the surfaces. To fabricate the diamond plate of the invention, the inequalities shall be valid at arbitrary points near the surfaces. In this case, the non-diamond density $W(x, y, O)$ or the defect concentration $D(x, y, o)$ on the rake surface shall be replaced by the non-diamond density $W(x, y, \epsilon)$ or the defect concentration $D(x, y, \epsilon)$, and the non-diamond density $W(x, y, T)$ or the defect concentration $D(x, y, T)$ shall be replaced by the non-diamond density $(x, y, T-\epsilon)$ or the defect concentration $D(x, y, T-\epsilon)$, where $0 < \epsilon < T/2$. Instead of the inequality (5) or (10), this invention is otherwise expressed by $$G_\epsilon < H_\epsilon \tag{11}$$

$$U_\epsilon < V_\epsilon \tag{12}$$

The reason why the thickness of the diamond plate is more than 40 μm will be now explained. One reason is that the diamond thinner than 40 μm has not enough strength and is likely to be broken. Another reason is that maximum difference of height between the most worn-out place and the least worn-out place at the end of life time is more than 40 μm in most cases.

If higher abrasion resistance is required, the thickness shall preferably be 0.07 mm to 3.0 mm. Furthermore, if the production cost would cause no serious problems, the diamond plate with the thickness more than 3 mm would be more profitable. Since diamond has the highest heat conductivity, the thicker the diamond plate is, the higher the heat diffusivity rises. The high heat diffusivity prevents the tool edge from being too hot.

The most conspicuous feature of this invention is the inequality $G_0 < H_0$ or $U_0 < V_0$. On the contrary, if $G_0 \geq H_0$ or $U_0 \geq V_0$, the fixation surface would not act as a stress alleviation layer or a shock absorber layer and the diamond plate would be likely to be chipped and to be easily worn out.

MEASUREMENTS

Next question is how to measure the non-diamond density or the defects concentration in a diamond plate. The X-ray diffraction analysis cannot measure the density of the non-diamond ingredients (amorphous carbon, carbon, graphite and crystalline carbon other than diamond structure) in diamond. The inventors think the Raman scattering spectrometry is the most suitable technique for measuring the non-diamond density.

In short, the Raman scattering means the phenomenon that an incident light wave (photon) inelastically scattered in a matter excites a phonon and a photon, and a light wave (photon) with different wavelength is emitted by the interaction between the phonon and the photon. The light inelastically scattered is called Raman scattering light. Besides phonon, plasmon or magnon induces the Raman scattering of light. In the case of liquid or gas, the interaction between molecular vibration and photon induces the Raman scattering. The energy difference between the incident photon and the scattered photon coincides with the energy difference between the ground state and one of excited states of the material. Thus, the energy spectrum of the scattered light gives us the information about the energy levels of the material. The Raman scattering spectrum of pure materials, e.g. pure graphite, pure diamond or pure amorphous carbon have been measured. There are some eigen spectral peaks which represent the materials. Then the Raman scattering measurement reveals what structure consists in an unidentified material. Since the Raman scattering light emitted from any portion of a sample can be measured, it can teach us local fluctuations of compound density also. Thus the Raman scattering measurement informs us the non-diamond density at any point of a sample. On the contrary, since the X-ray diffraction analysis depends on the periodic crystalline structure of a sample, we cannot obtain the information of local fluctuations of crystal structure in a sample by the X-ray diffraction analysis.

The Raman scattering measurement requires a laser for exciting a sample by a strong light, an optical apparatus for focusing the laser light on a sample, a spectrometer for scanning the wave length of light (or the wave number of light), a photodetector for detecting the strength of the monochromatic light and electronic devices for amplifying the light intensity and processing the electronic signals.

The light of 488 nm or 514 nm in wave length of argon lasers is used for the light for exciting the sample. In this case, the exciting laser light radiates the sample, i.e. the diamond plate which is fixed on the edge of a tool. A Raman scattered light is emitted from the diamond sample. The light is monochromatized by the spectrometer and is introduced into a photodetector, e.g. a multichannel detector. In the usual Raman scattering measurement, the back scattering light is measured. However another method of the Raman scattering measurement called microscope Raman scattering measurement is also available in this case. In the method, the exciting laser light is focused into a small spot of tens of micrometers in diameter on a sample by an optical microscope. The light is scattered only at the small spot of the sample. Thus the microscope Raman scattering measurement enables us to obtain local information of the sample.

To confirm the features of the diamond of this invention, two spots must be examined by the Raman scattering measurement. One is a spot on or near the rake surface. The other is a spot on or near the fixation surface. In the former case, the usual Raman back scattering measurement is available, when the exciting laser light shoots on the diamond sample at a right angle to the surface, because most of the Raman back scattering light comes from the rake surface. But in the case of the later case, the usual Raman back scattering measurement does not work, because the Raman scatterings mainly occur near the rake surface. In order to investigate the property of the fixation surface, the microscope Raman scattering measurement must be employed, because the exciting light can be focused into tens of micrometers in diameter at an arbitrary depth of the sample.

However, in the microscope Raman scattering measurement, we must take caution against overheating of the sample, since the focused laser light is likely to overheat a point of the sample locally. The localized overheating causes the change of the property of the sample or the shift of the peak of the Raman spectrum. Rigorous measurement requires cooling the sample by blowing helium gas to it, confirming whether the profile of the Raman scattering spectrum is symmetric or not, or confirming whether the shift of the peak in the scattering spectrum is induced by rising of temperature or by changing the output power of the laser. Further, sufficient adjustments of the optical axes of the optical parts and the width of the slit of the spectrometer are also required to heighten the resolving power of the spectrometer.

There is only one first order Raman peak revealing at 1332.5 cm$^{-1}$ which is threefold degenerated in the Raman scattering spectrum of diamond. Second order Raman peak is as weak as one five hundredth of the first order peak in intensity. Thus, only the first order peak should be taken into consideration to estimate the quality of diamond itself.

There are two different methods based on the peaks of the Raman scattering spectrum to estimate the quality of diamond. One is a method to estimate it by the half width of the peak corresponding to diamond. The other is a method to estimate it by the height of the peak.

This invention uses the half width of the peak at the wave number of 1332.5 cm$^{-1}$ to measure the defect concentration. It is known that defects, stress and disorder of lattice structure of diamond widen the half width of the peak at 1332.5 cm$^{-1}$. On the contrary, highly crystalline structure narrows down the half width of the peak. Plenty of segregation of non-diamond ingredients conspicuously widens the half width. However even in the case of little segregation of non-diamond ingredients, the half width becomes broad, if the crystalline structure of diamond is forcedly broken, e.g. by the ion implantation.

One method of the invention is to grow the diamond plate with defects changing along the direction of thickness. The defects (dislocations, stacking faults) can practically be observed by the Transmission Electron Microscope (TEM). The x-ray diffraction measurement gives us the information of the states of defects.

The non-diamond ingredients defined by this invention include all carbon ingredients without crystalline diamond structure. For example, amorphous carbon, glassy carbon, highly disordered graphite having disordered lattice structure based on graphite crystal: e.g. activated carbon, or crystalline carbon, e.g. graphite are included in the non-diamond ingredients. The highly disordered graphite is mainly taken into consideration in this invention. Since the chemical vapor deposition methods grow diamond polycrystals from thermal non-equilibrium state, the segregation of the non-diamond ingredients accompanies the growth of diamond under some condition. In ordinary diamond growth, the non-diamond ingredients are only obstacles. But this invention positively makes use of the segregation of the non-diamond ingredients. Like diamond, the non-diamond ingredients are also active to the Raman scattering. The Raman scattering spectrum of the non-diamond ingredients has a broad peak between 1000 cm$^{-1}$ and 2000 cm$^{-1}$ in wave number. The position, width or height of the peak slightly changes according to the degree of disorder of graphite structure. However, other peaks except for the sharp peak of 1332.5 cm$^{-1}$ owing to diamond can be safely attributed to the non-diamond ingredients.

Here we define the invention by two different ways again. This invention is,

①  a polycrystalline diamond tool defined by the non-diamond ingredients in the diamond, or ②  a polycrystalline diamond tool defined by the defects in the diamond.

① DEFINITION BY THE DENSITY OF THE NON-DIAMOND INGREDIENTS

A polycrystalline diamond tool comprising a tool body having an edge surface and a polycrystalline diamond plate having a rake surface and a fixation surface, the diamond plate being fixed to the edge surface of the tool, the polycrystalline diamond plate being more than 40 μm in thickness, characterized in that the polycrystalline diamond includes non-diamond ingredients and the density of the non-diamond ingredients increases along the direction of thickness from the rake surface to the fixation surface.

Preferably, the density of the non-diamond ingredients at a point distanced from the rake surface by a length less than the shorter of either 30% of the average thickness or 40 μm, is smaller than the density of the non-diamond ingredient at a point distanced from the fixation surface by a length less than the shorter of either 30% of the average thickness or 40 μm.

The same invention can also be defined by the Raman scattering spectrum otherwise than the non-diamond density, since the non-diamond ingredients cause some peaks in the Raman scattering spectrum.

Polycrystalline diamond tool comprising a tool body having an edge surface and a polycrystalline diamond plate having a rake surface and a fixation surface, the diamond plate being fixed to the edge surface of this tool, the polycrystalline diamond plate being more than 40 μm in thickness, characterized in that the ratio ($X_1/Y_1$) of the peak height $X_1$ of the non-diamond ingredients to the peak height $Y_1$ of diamond in the Raman scattering spectrum at a point distanced from the rake surface by a length less than the shorter of either 30% of the average thickness or 40 μm, is smaller than the ratio ($X_2/Y_2$) of the peak height $X_2$ of the non-diamond ingredients to the peak height $Y_2$ of diamond at a point distanced from the fixation surface by a length less than the shorter of either 30% of the average thickness or 40 μm in the Raman scattering spectrum. Namely, $X_1/Y_1 < X_2/Y_2$.

FIG. 5 shows an example of a Raman scattering spectrum of a diamond plate. The method for determining the height X of the peak of the non-diamond ingredients comprises the steps of drawing a base line of the background, e.g. owing to the fluorescence, finding the highest, broad peak except the peak of diamond (1332.5 cm$^{-1}$) and measuring the height of the peak from the base line. The height is X. Since carbon is Raman—active material, broad peaks except the peak of diamond are considered to be caused by the non-diamond ingredients, e.g. amorphous carbon, highly disordered graphite. The peaks of the non-diamond ingredients lie between 1000 cm$^{-1}$ and 2000 cm$^{-1}$ in wave number. Since the wave number (abscissa in the spectrum) of the peak depends on the degree of disorder, the wave number of the peak varies between 1000 cm$^{-1}$ and 2000 cm$^{-1}$ according to the degree of disorder. We cannot predetermine the wave number of the peak of the non-diamond ingredients, because we have no information about the degree of disorder or kinds of non-diamond ingredients before the measurement. Thus the next highest peak between 1000 cm$^{-1}$ and 2000 cm$^{-1}$ shall be considered as the peak of the non-diamond ingredients. FIG. 5 is a typical Raman scattering spectrum of a sample in which the non-diamond ingredients coexist with diamond.

The peak of diamond appears at the wave number of 1332.5 cm$^{-1}$ as mentioned before many times. The value 1332.5 cm$^{-1}$ corresponds to normal diamond which consists of the isotopes $_{12}$C and $_{13}$C in a normal ratio. If the ratio of the isotope $_{13}$C is bigger than the normal ratio, the wave number of the peak of diamond slightly shifts toward low wave number (toward low energy). Because of the fluctuation of the ratio of carbon isotopes, the peak may slightly shift right or left in the Raman scattering spectrum. Like the measurement of the height X of the peak of the non-diamond ingredients, the height Y of the peak of diamond shall be defined as the distance between the top of the peak and the point on a base line with the same wave number. But since the peak of diamond is usually superposed on the tail of the peak of the non-diamond ingredients, a new base line is drawn under the diamond peak to eliminate the background owing to the non-diamond peak. Thus the height Y of the diamond peak is defined as the height from the newly drawn base line. Therefore, the base lines are different in the cases of defining X and Y.

Since the heights X and Y depend on how to draw the base lines, it is desirable to draw exact base lines for separating signals from the background. However, even an easy drawing of base lines enables us to compare the ratio $X_1/Y_1$ near the rake surface with the ratio $X_2/Y_2$ near the fixation surface qualitatively.

② DEFINITION BY THE DEFECT CONCENTRATION

A polycrystalline diamond tool comprising a tool body having an edge surface and a polycrystalline diamond plate having a rake surface and a fixation surface, the diamond plate being fixed to the edge surface of the tool, the polycrystalline diamond plate being more than 40 μm in thickness, characterized in that the polycrystalline diamond includes defects, and the defect concentration increases along the direction of thickness from the rake surface to the fixation surface.

Preferably, the defect concentration at a point distanced from the rake surface by a length less than the shorter of either 30% of the average thickness or 40 μm, is smaller than the defect concentration at a point distanced from the fixation surface by a length less than the shorter of either 30% of the average thickness or 40 μm.

The same invention can also be defined by the Raman scattering spectrum otherwise than the defect concentration, since the defects are likely to widen the peak of diamond in the Raman scattering spectrum.

A polycrystalline diamond tool comprising a tool body having an edge surface and a polycrystalline diamond plate having a rake surface and a fixation surface, the diamond plate being fixed to the edge surface of the tool, the polycrystalline diamond plate being more than 40 μm in thickness, characterized in that the half width ($\alpha$ cm$^{-1}$) of the peak of diamond in the Raman scattering spectrum at a point distanced from the rake surface by a length less than the shorter of either 30% of the average thickness or 40 μm, is smaller than the half width ($\beta$ cm$^{-1}$) of the peak of diamond in the Raman scattering spectrum at a point distanced from the fixation surface by a length less than the shorter of either 33% of the average thickness or 40 $\mu$m. Namely $\alpha < \beta$.

The measurement of the half width $\alpha$ or $\beta$ is now demonstrated by FIG. 6. First, a base line shall be drawn below the peak of diamond for eliminating the background, e.g. owing to the fluorescence or the non-diamond ingredients. Second, the height of the peak shall be measured. Third, the width of the peak at the half height shall be measured. The width is the half width $\alpha$ or $\beta$ of the peak.

FABRICATION OF A DIAMOND TOOL

The method for fabricating a diamond plate will be now briefly explained by means of FIG. 2. Since the diamond plate is grown by the chemical vapor deposition methods, an easiest way to change the quality of diamond along the direction of thickness is changing the density of carbon in material gas continuously or stepwise (either increasing monotonously or decreasing monotonously). Increasing the density of carbon is more preferable than decreasing the density of carbon. The reason will be explained afterward. Besides the density of carbon, the quality of diamond can be changed by varying the density of oxygen or the density of nitrogen in the material gas.

Material gas is supplied onto a substrate (6) heated in a CVD apparatus which will be explained in detail later. Being excited by some means, the material gas is dissolved into active radicals or ions and is reacted each other on the substrate. Diamond layer is growing on the substrate, which is shown by FIG. 2(b). The density of carbon in the material gas is changing continously or stepwise in this invention. After the diamond layer (7) grows to the predetermined thickness on the substrate (6) by the CVD method, the substrate (6) is etched away by hydrofluoric, nitric acid (mixture of hydrofluoric acid and nitric acid) or aqua region. Then a diamond plate is obtained (FIG. 2(c) ).

Diamond itself has poor wettability with the tool body made from cemented carbide. Then to improve the wettability between the tool body and the diamond plate, one surface of the diamond plate is metalized by evaporation coating of metal (FIG. 2 (d) ). Then the diamond plate is divided into several chips of diamond with determined size suitable for the tool edge by a YAG laser (FIG. 2 (e) ). Then the metalized surface is fitted onto the edge surface of the tool (FIG. 2 (e) ). In those processes, it is also possible to divide the diamond plate earlier than to etch away the substrate.

FIG. 3 shows the sectional view of the tool fitted with the diamond plate. The tool body can be made from any hard metal. But preferably cemented carbide shall be employed as a material of the tool body. The tool edge has the edge surface on which the diamond plate is fixed through the intermediary of the metallized layer. Brazing is desirable to fix the diamond plate on the edge surface for the sake of high heat resistance and high strength.

Geometric relation for defining this invention is now explained by FIG. 4. The diamond plate has two parallel surfaces. The free surface distance far from the edge surface of the tool is the rake surface. As mentioned before, a three dimensional coordinate is defined on the diamond plate. The x-axis and y-axis lie on the rake surface. The z-axis is defined along the direction of thickness from the rake surface to the fixation surface. The rake surface is denoted by $z=0$. The fixation surface is denoted by $Z=T$, where T is the thickness of the diamond plate. The first dotted line in the vicinity of the rake surface is a plane which is the plane nearer to the rake surface of either the plane $z=0.3T$ or the plane $z=40$ $\mu$m. The region held by the rake surface and the first dotted plane is the observation region on the side of the rake surface. The laser light irradiates it from the front edge of the region. The incident light is parallel with the surfaces.

The second dotted line in the vicinity of the fixation surface is a plane which is the plane nearer to the fixation surface of either the plane $z=0.7T$ or the plane $z=T-40$ $\mu$m. The region held by the fixation surface and the second dotted plane is the observation region on the side of the fixation surface. The laser light irradiates it from the front edge of the region. The incident light is parallel with the surfaces also.

With regard to the partial observation region, the definition may not be clear yet. If the average thickness T of the diamond plate is less than 133 $\mu$m (40 $\mu$m $\leq T \leq 133$ $\mu$m), the first observation region is defined as $0 \leq z \leq 0.3T$, and the second observation region is defined as $0.7T \leq z \leq T$. On the contrary, if the average thickness of the diamond plate is more than 133 $\mu$m (133 $\mu$m $< T$), the first observation region is defined as $0 \leq z \leq 40$ $\mu$m and the second observation region is defined as $T-40$ $\mu$m $\leq z \leq T$.

The non-diamond densities G$\epsilon$ and H$\epsilon$, or the defect concentrations U$\epsilon$ and V$\epsilon$ at these partial observation regions are put into the question in this invention. And to measure G$\epsilon$ and H$\epsilon$ or U$\epsilon$ and V$\epsilon$, the ratios $X_1/Y_1$ and $X_2/Y_2$ of the peak heights, or the half widths of the peak of the Raman scattering spectrum are used in this invention.

When a diamond plate is grown by the CVD method, the non-diamond density and the defects concentration must be changed according to the teaching of this invention. Increasing of these parameters is better than decreasing of these parameters. The reason will be now explained here.

When diamond is grown on a smooth substrate, the surface is contact with the substrate is very smooth. But the free surface which has deposited on the diamond layer at the end of the crystal growth becomes a ragged surface which is inherent to the CVD-grown polycrystal diamond. This is called hexa-octahedron structure of diamond. If the ragged free surface was assigned to be a rake surface, the ragged pattern of the rake surface would be transcribed on the surface of an object to be cut. To avoid the inconvenience, the ragged free surface which has grown at the end of the growth must be metalized and be fitted to an edge surface of a tool. Thus the smooth surface which has been in contact with the substrates becomes the rake surface of the tool.

Since the fixation surface must include the non-diamond ingredients or the defects more than the rake surface, the density of carbon in the material gas shall be low at the beginning of the growth, shall monotonously be increased and shall be high at the end of the growth. This treatment has the advantages of raising the deposition speed, lowering the cost of growth in comparison with the treatment wherein the density of carbon would be monotonously decreased, a free ragged surface would be abraded and the free surface would be fixed to the tool.

Besides, the treatment has another advantage. The grain of polycrystalline diamond is small at the beginning of the crystal growth. According to the progress of the crystal growth, the grain size of crystal becomes larger. Thus the rake surface has smaller grains and the fixation surface has bigger grains. Since the big grains of diamond polycrystal are like to lower the rigidity, the big grains of diamond polycrystal near the fixation surface can absorb an external shock and can raise the chip resistance.

But this order of processes is not indispensable in this invention. The processes can be reversed. The density of carbon in the material gas shall be lowered in this case. The free surface which has been made at the end of the growth shall be ground and shall be assigned to be a rake surface. However, this order of process would increase number of the processes and raise the cost for production.

PRODUCTION OF DIAMOND LAYER

When diamond is grown by the CVD methods, the material gas includes;

① hydrogen gas
② carbon-containing gas; methane, ethane, acetylene, ethyl alcohol, methyl alcohol, acetone, etc.

Besides the examples, any material including carbon which can be vaporized may be used as gas ②. Although alcohol and acetone are liquid at room temperature, they are vaporized by heating. Otherwise, they can be vaporized by bubbling them with hydrogen gas.

Besides gas ① and gas ②, rare gases (helium, neon, argon, krypton, xenon and radon) may be mixed into the gases e,crc/1/ and ②. In the case of the CVD methods in which the material gas is activated by plasma, the rare gas increases the density of active elements, e.g. hydrogen radicals or $C_2$, prolongs the life time of the radicals and contributes the grow diamond with uniform quality.

The substrate on which diamond shall be deposited is either W, Mo, Ta, Nb, Si, SiC, WC, $W_2C$, $Mo_2C$, TaC, $Si_3N_4$, AlN, Ti, TiC, TiN, B, BN, $B_4C$, diamond, $Al_2O_3$ or $SiO_2$. Furthermore, Cu or Al can be used as a substrate under the special conditions. The substrate is not necessarily a flat plate. This invention can also be applied to the tools having edges with adequate curvature, e.g. a twisted blade or an end mill blade. In this case, the substrate shall be the plate with the curvature as same as that of the tool blade.

In this invention, the density of carbon in the material gas shall be changed during the crystal growth to change the defect concentration or the non-diamond density along the direction of thickness. An easy way is increasing the density of carbon continuously or stepwise. The easiest way is changing the density of carbon in two steps i.e. lower density at the former step and higher density at the latter step. Three typical examples of the density of carbon will be explained here.

① For example in the former step, diamond is grown by a lower carbon material gas containing hydrogen and methane (methane/hydrogen=about 1%). In the latter step, diamond is grown by a higher carbon material gas containing hydrogen and methane (methane/hydrogen=about 2.5%).

In the former step, if an oxygen containing gas, e.g. $O_2$ gas or $H_2O$ is added by a very small quantity, oxygen improves the quality of crystal structure, suppresses the segregation of the non-diamond ingredients and decreases the defect concentration in the diamond layer.

In this case, it is also possible that the density of carbon in the former step may be higher than that in the latter step, if the density of oxygen is enough to suppress the segregation of the non-diamond ingredients or to decrease the defect concentration.

② For example, in the former step, diamond is grown by hydrogen, methane and oxygen gas (methane/hydrogen=about 2%, oxygen/hydrogen=about 0.2%).

In the latter step, diamond is grown by hydrogen and methane gas (methane/hydrogen=about 3%).

③ On the contrary, to lower the crystalline quality in the latter step, a nitrogen containing gas shall be mixed into the material gas by a very small quantity. For example, in the former step, diamond is grown by hydrogen and methane gas (methane/hydrogen=about 1%). In the latter step, diamond is grown by hydrogen, methane and nitrogen gas (methane/hydrogen=about 2%, nitrogen/hydrogen=about 0.5%). In this case, it is possible that the density of carbon in the latter step may be higher than that in the former step, if the density of nitrogen is enough to cause the segregation of the non-diamond ingredient or to increase the defects.

In general, nitrogen gas has been considered as inactive as rare gases in chemical reactions so far. However, the inventors have noticed that nitrogen has serious influence upon the crystal growth of diamond. A small quantity of nitrogen gas severely impairs the quality of the CVD grown diamond. At this point, nitrogen is totally different from rare gases. On the contrary a small quantity of oxygen improves the quality of diamond.

ADVANTAGES OF THE INVENTION

This invention grows the diamond plate with the quality changing along the direction of thickness by changing the composition of material gas supplied into the CVD apparatus. The diamond tool of this invention excels in strength, abrasion resistance, chip resistance, adhesion resistance and heat resistance.

The reason why the diamond tool based on this invention is endowed with such properties is now explained. The diamond plates which have been synthesized by the CVD methods so far have uniform property overall. The diamond of high crystalline quality has very high rigidity. But the diamond is easily broken by an external shock. Namely, a good diamond of high crystalline quality lacks chipping resistance. Thus the tools having a good diamond plate are likely to be broken in a short time when they are used to cut or shave something. Perfect lattice structure of the diamond of good quality heightens the rigidity. Because of the high rigidity, the perfect diamond is likely to be chipped. High chipping resistance does not consist with high rigidity.

Is the diamond of bad quality more suitable for tools than the diamond of good quality? The diamond with disordered crystalline structure and high non-diamond ingredient density excels in toughness or chipping resistance, because of the proper elasticity. But they are inferior to the good diamond in strength, abrasion resistance, because of the low rigidity.

A good tool requires both chipping resistance and abrasion resistance. Determining the non-diamond density or defect concentration within some range in the diamond plate does not give us a diamond tool with the most suitable properties. The surface which will contact the objects to be cut requires high abrasion resistance. However, the toughness should be heightened to increase the chipping resistance. Toughness and rigidity are reciprocal properties. It is very difficult to heighten both the toughness and the rigidity of the same object.

Therefore, this invention gives complementary properties to the diamond plate along the direction of thickness. The rake surface which will contact the objects is made from better diamond with lower non-diamond density or lower defect concentration. Thus, the rake surface has high abrasion resistance. The fixation surface which is fixed on the tool is made from worse diamond with higher non-diamond density or higher defect concentration. Thus, the fixation surface is rich in elasticity and toughness.

When an external shock is applied on the rake surface, the more elastic diamond near the fixation surface will alleviate and absorb the shock by shrinking. The elasticity of the diamond near the fixation surface endows the diamond tool with high quality.

The abrasion resistance of a tool depends on the rake surface. In this invention, the diamond on the rake surface has a highly ordered crystalline structure with high rigidity. Thus, the diamond tool reveals enough abrasion resistance even against the object difficult to cut or shave. For the sake of the life time as a tool, it is desirable that the region held between the rake surface and the plane distanced from the rake surface by the shorter of either 40 $\mu$m or 30% of thickness is made from the diamond of high quality.

In the case of sintered diamond, the abrasion resistance is restricted by the binder. And adhesion resistance is also suppressed by the binder. Unlike the sintered diamond, the CVD grown diamond is inherently rich in abrasion resistance and adhesion resistance, because it includes no binder.

The diamond tool of this invention is suitable for the tools which require high abrasion resistance, high chip resistance, high strength and high adhesion resistance, e.g. the tools for cutting, tools for grinding tools for digging or dressers.

DETAILED DESCRIPTION OF THE EMBODIMENTS

This invention can be applied to all the CVD methods which are able to synthesize diamond. The inventors have applied it to the following CVD methods;
① filament CVD method (FIG. 7)
② microwave plasma CVD method (FIG. 8)
③ heat-exciting CVD method (FIG. 9)
④ heat plasma CVD method (FIG. 10)

Common substrates are used for all the embodiments. The substrate is a polycrystal silicon plate of 14 mm × 14 mm × 0.2 mm. One surface has been lapped with the abrasive containing granules of 0.5 $\mu$m to 5 $\mu$m in diameter until the maximum roughness $R_{max}$ became less than 1.2 $\mu$m ($R_{max} < 1.2$ $\mu$m). The apparatuses for the CVD methods are explained. Then the results this invention has brought about on the apparatus will be described.22

EMBODIMENT ①

Filament CVD Method

Figure 7:
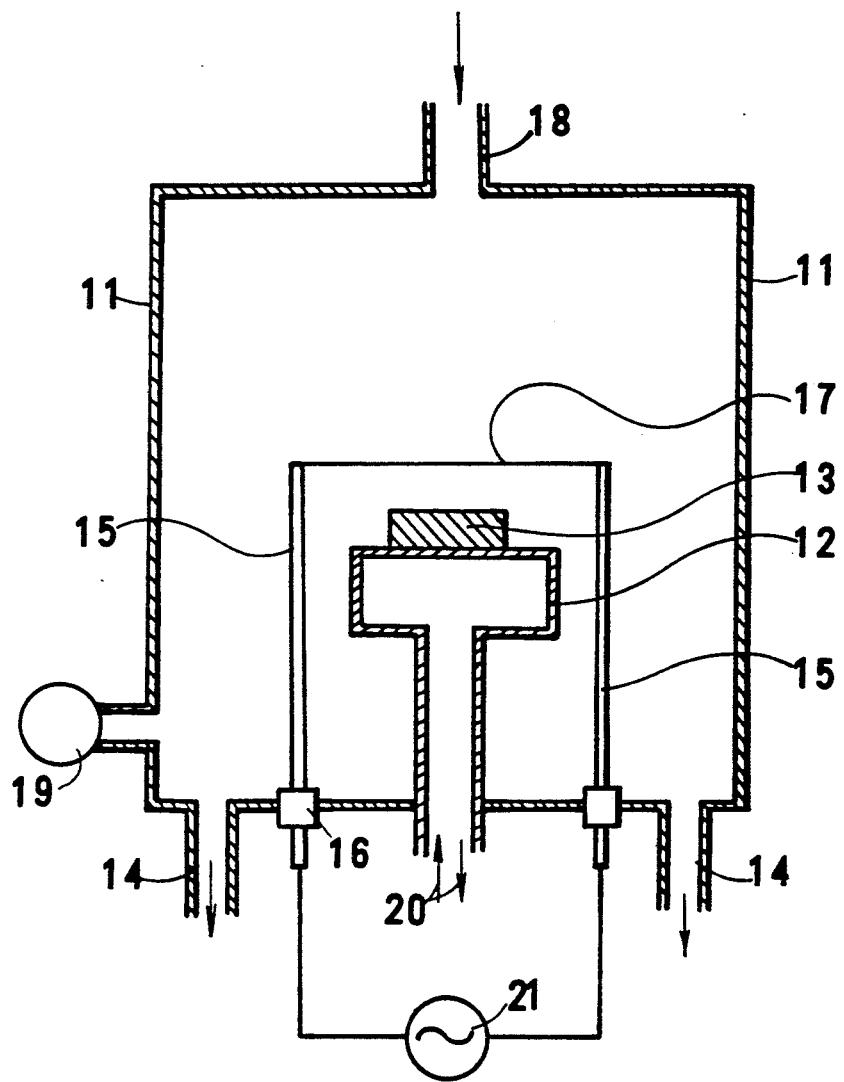
FIG. 7 is a schematical sectional view of a filament CVD apparatus.

FIG. 7 shows the filament CVD apparatus. In a vacuum chamber (11), a susceptor (12) is installed. A substrate (13) is mounted on the susceptor (12). The vacuum chamber (11) has an exhaust outlet (14) which is connected to a vacuum pump (not shown in the figures). Electrodes (15) are stood in the vacuum chamber (11). The electrodes (15) penetrate insulators (16) and are connected to a filament power source (21). Filaments (17) span electrodes (15). Material gas is supplied into the vacuum chamber (11) through a gas inlet (18). A vacuum gauge (19) measures the vacuum in the vacuum chamber (11). Cooling water (20) is introduced into the inner space of the susceptor (12) for cooling it.

Three kinds of filaments made from different materials had been prepared. One was 4N-W (tungsten of 99.99% in purity), the other was 4N-Ta (tantalum of 99.99% in purity) and the third was 4N-Re (rhenium of 99.99% in purity). The temperature of the filaments (17) was measured by an optical thermometer. The temperature of substrate (13) was monitored by a Chromel-Almel thermocouple fixed to the surface of the substrate (13).

Figure 11:
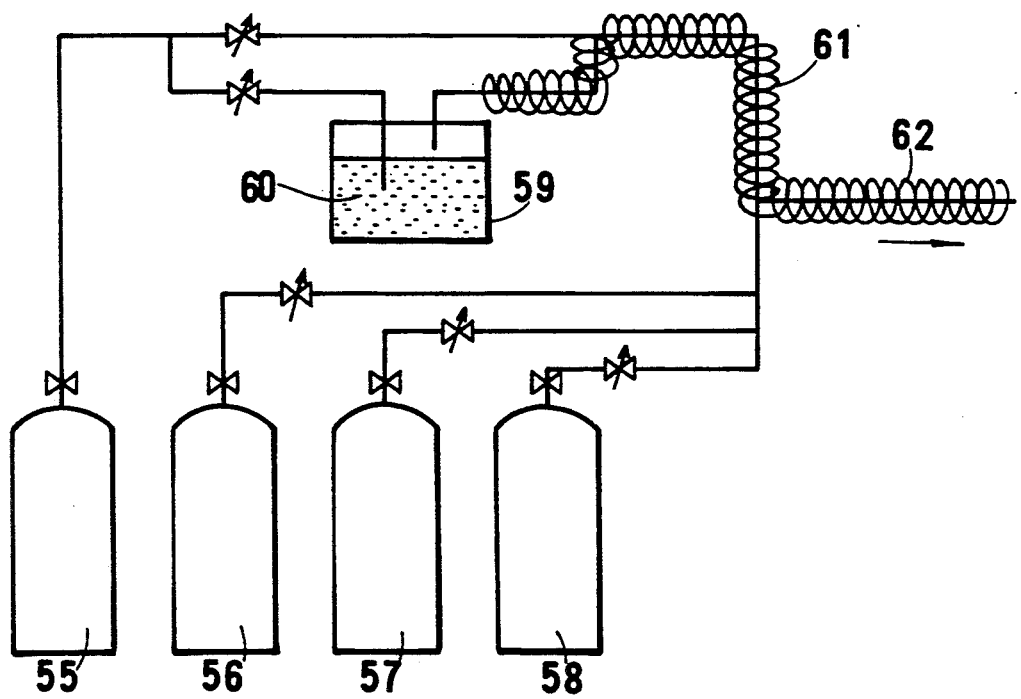
FIG. 11 is a schematical view of the system for supplying the material gas.

FIG. 11 shows the system for supplying the material gas. This system can be also applied to all the CVD apparatuses which will be explained later.

A hydrogen gas cylinder (55), a rare gas cylinder (56), a carbon containing gas cylinder (57), an oxygen containing nonorganic gas cylinder (58) are equipped. The gases of these gas cylinders are supplied to the CVD apparatus through pipes, valves and mass flow controllers. Hydrogen gas is mixed with the other gases as a carrier gas. A part of hydrogen gas passes through a bubbling device (59) to evaporate and carry the material which is liquid at room temperature. Some liquid, e.g. water ($H_2O$) or ethyl alcohol ($C_2H_5OH$) is stored in the bubbling device (59). The pipes following the bubbling device (59) are enclosed with tape heaters (61) winding around the pipes.

By the filament CVD apparatus, diamond plates were grown on the silicon substrate under various conditions with different components of material gas, different growing time, different pressure of different temperature of growth, according to this invention and the conventional method (uniform quantity in whole). Table 1 shows the result.

TABLE 1

CONDITIONS FOR SYNTHESIZING DIAMOND BY FILAMENT CVD METHOD

| sample | steps | material gas (SCCM) | time (H) | pressure (Torr) | filament material | filament temperature |
|---|---|---|---|---|---|---|
| A | 1 | $H_2$ 600 $CH_4$ 5.0 | 50 | 80 | W | 2150 |
|   | 2 | $H_2$ 600 $CH_4$ 12.0 | 20 | 80 | W | 2150 |
| B | 1 | $H_2$ 600 $CH_4$ 2.0 | 60 | 130 | Ta | 2400 |
|   | 2 | $H_2$ 1000 $CH_4$ 25 | 15 | 130 | W | 2100 |
| C | 1 | $H_2$ 600 $CH_4$ 12 $H_2O$ 2 | 7 | 50 | W | 1800 |
|   | 2 | $H_2$ 600 $CH_4$ 6 | 13 | 80 | Re | 2080 |
|   | 3 | $H_2$ 600 $CH_4$ 10 | 45 | 40 | Ta | 2350 |
|   | 4 | $H_2$ 600 $CH_4$ 30 | 10 | 120 | W | 2200 |
| D | 1 | $H_2$ 600 $CH_4$ 2.5 | 100 | 60 | W | 2150 |
|   | 2 | $H_2$ 600 $CH_4$ 15 $N_2$ 1 | 15 | 80 | W | 2100 |
| E | 1 | $H_2$ 600 $CH_4$ 25 | 30 | 80 | Ta | 2400 |
| F | 1 | $H_2$ 600 $CH_4$ 2 | 170 | 80 | W | 2200 |
| G | 1 | $H_2$ 600 $C_2H_5OH$ 5 | 155 | 50 | Re | 2100 |
| H | 1 | $H_2$ 600 $CH_4$ 20 | 20 | 120 | W | 2150 |
|   | 2 | $H_2$ 600 $CH_4$ 5 | 55 | 60 | W | 2150 |

Samples A to D are embodiments of this invention and samples E to H are comparison examples based on the conventional method in Table 1.

In the embodiments A to D and the comparison examples E and F, the components of material gas or the ratio of the components were changed with time. For example, in the embodiment A, the substrate was coated in the material gas flow comprising 600 sccm of hydrogen gas ($H_2$) and 5 sccm of methane gas ($CH_4$) under 80 Torr by heating with the tungsten filament at 2150° C. for 50 hours at the first step. Then the substrate was coated in the material gas flow comprising 600 sccm of hydrogen gas ($H_2$) and 12 sccm of methane gas ($CH_4$) under 80 Torr by heating with the tungsten filament at 2150° C. for 20 hours at the second step. Here "sccm" is a simplified expression of a unit of gas flow "standard cubic centimeter". 1 sccm means that 1 cm³ of gas reduced in the standard state i.e. at 0° C. under 1 atmosphere flows per minute. The embodiment A changed the component ratio of the material gas in two steps. Other two embodiments B and D changed the component ratio of the material gas. The embodiment C changed the components of component ratio of the material gas in four steps.

The comparison example E synthesized diamond with the material gas with high density of carbon in a single step. The comparison example F synthesized diamond with the material gas with low density of carbon in a single step also. The comparison example H changed the component ratio of the material gas in two steps in contradiction to this invention.

In every sample, diamond grew on the substrate. Then the silicon substrate was solved away by a pertinent etchant. Square diamond plates were obtained. Each diamond plate was metalized and cut along the diagonal lines into four isosceles right-angled triangles.

Figure 1:
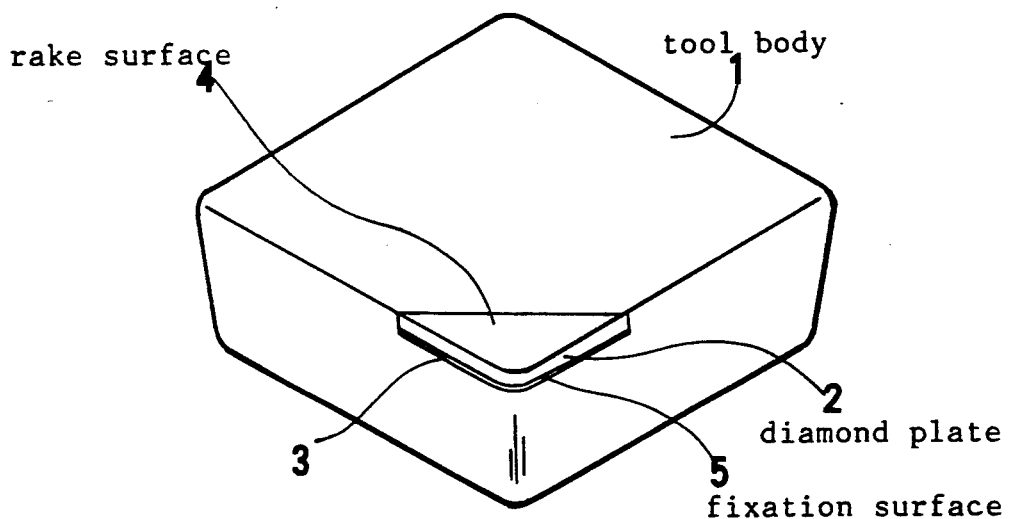
FIG. 1 is a simplified perspective view of a polycrystalline diamond tool.
Figure 3:
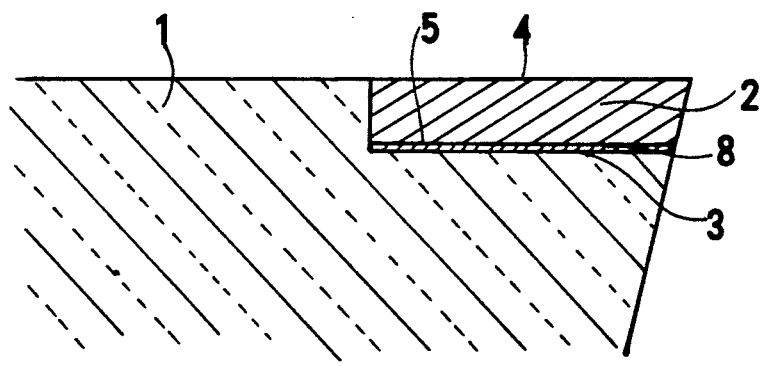
FIG. 3 is a sectional view of an edge of the diamond tool.
Figure 4:
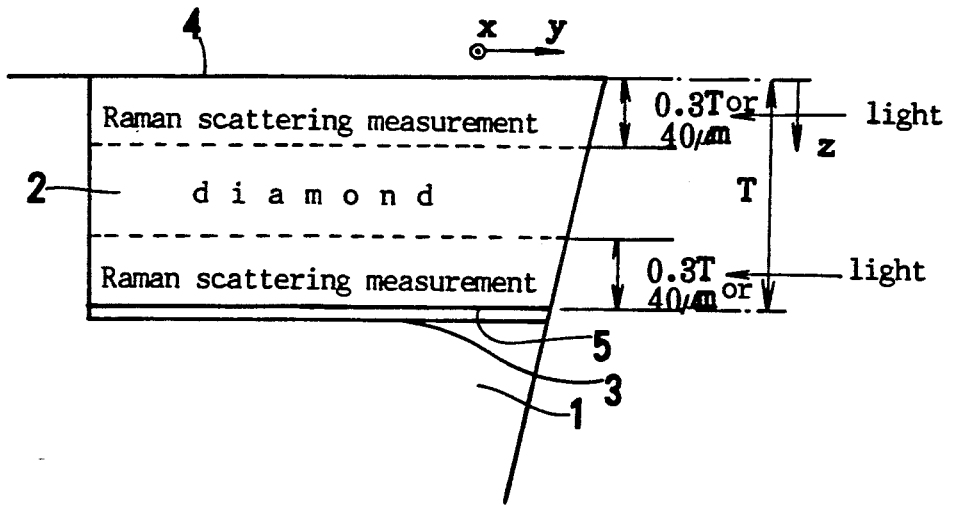
FIG. 4 is a sectional view of the diamond plate for showing the points for the Raman scattering measurement.
Figure 2:
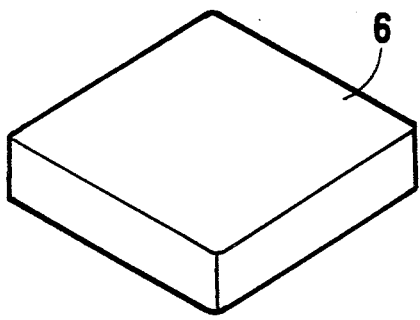
FIG. 2(a)–(f) is perspective views showing the steps for producing the polycrystalline diamond tool.
Figure 2:
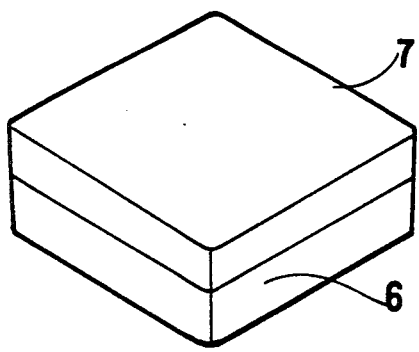
Figure 2:
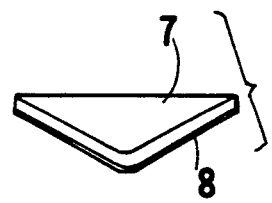
Figure 2:
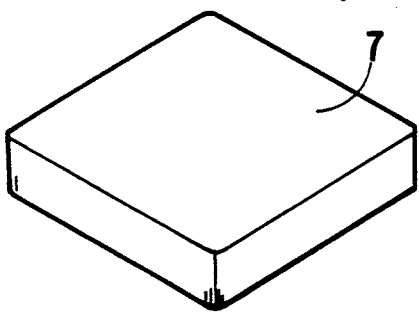
Figure 2:
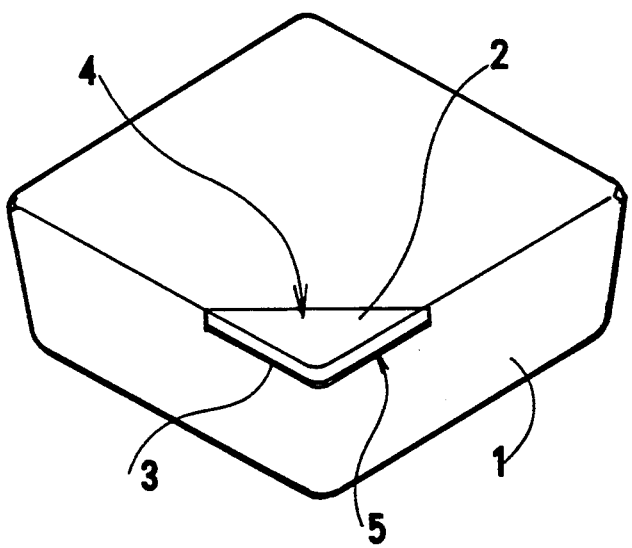
Figure 2:
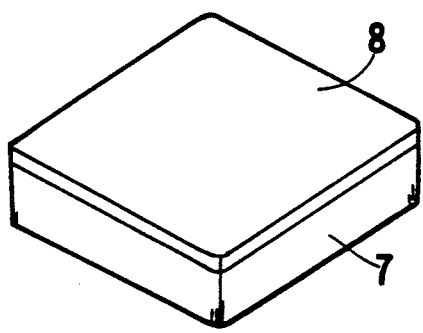
Figure 5:
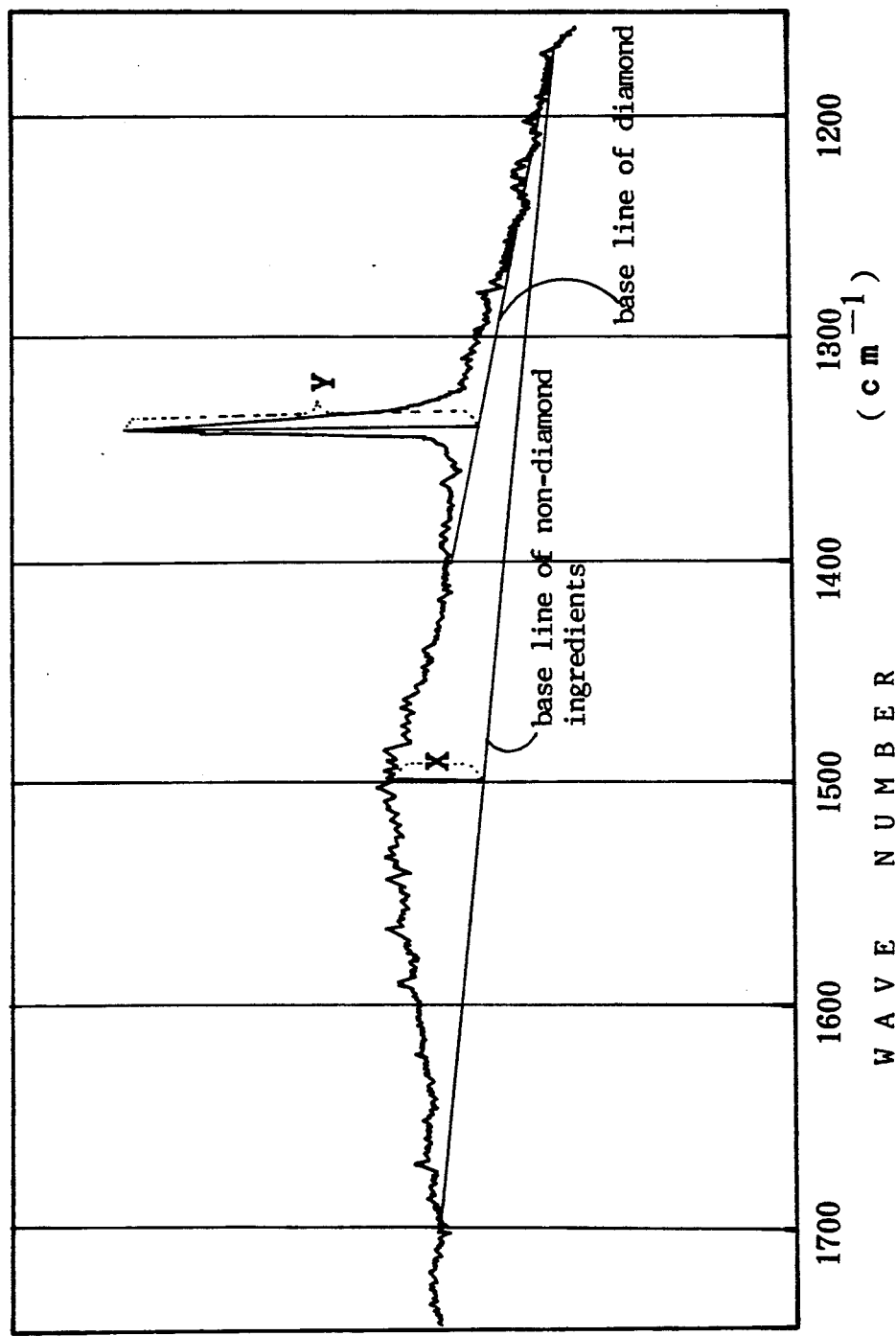
FIG. 5 is a graph of an example of the Raman scattering spectrum for demonstrating the definition of the peak height (X) for the non-diamond ingredients and the peak height (Y) for diamond.
Figure 6:
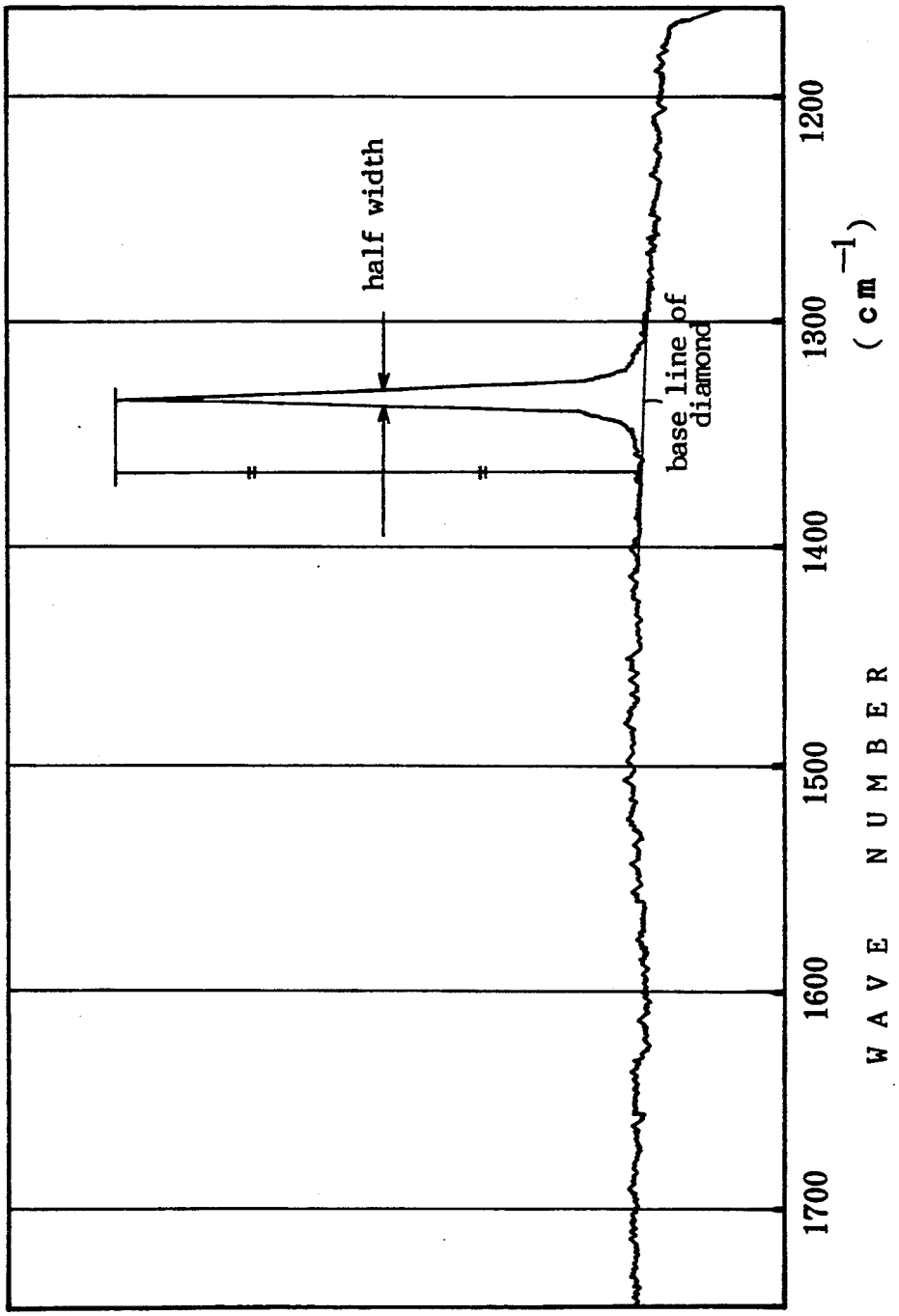
FIG. 6 is a graph of an example of the Raman scattering spectrum for demonstrating the definition of the half width of the peak for diamond.

These diamond plates were mounted and brazed on the tools made of cemented carbide according to the processes shown in FIG. 2. The free surfaces which had grown at the end of the growth were directly fixed to the tools. The surfaces which had grown at the beginning of the growth and were in contact with the substrate were assigned to be rake surfaces. The sample tools A to H were estimated by examining the quality of diamond by the Raman scattering measurement. Table 2 shows the results of the measurement. In table 2, sample names, partial layers, thicknesses of the partial layers, total thickness, observation points, ratio (X/Y) of the peak heights and half width of the peaks are listed. The observation points are denoted by the distance from the rake surface as shown in FIG. 4. The first layer is a layer nearer to the rake surface and the second layer is a layer nearer to the fixation surface in the samples A, B, C, D, E, F, G, H, I and J. "Y" is the height of the peak of the non-diamond ingredients. "X" is the height of the peak of diamond in the Raman scattering spectrum.

TABLE 2

RAMAN SCATTERING MEASUREMENT OF THE TOOLS

|  | sample | layer | thickness of layers | total thickness | observation point | X/Y | half width of diamond |
|---|---|---|---|---|---|---|---|
| EMBODIMENTS | A | 1 | 50 | 100 | 8 | 0.01 | 5.5 |
|  |  | 2 | 50 |  | 95 | 0.12 | 10.5 |
|  | B | 1 | 50 | 120 | 5 | 0.006 | 4.2 |
|  |  | 2 | 70 |  | 111 | 0.11 | 19 |
|  | C | 1 | 5 | 100 | 7 | 0.004 | 5.2 |
|  |  | 2 | 15 |  | 18 | 0.009 | 5.7 |
|  |  | 3 | 50 |  | 65 | 0.1 | 15 |
|  |  | 4 | 30 |  | 94 | 0.3 | 21 |
|  | D | 1 | 86 | 150 | 10 | 0.005 | 4.5 |
|  |  | 2 | 64 |  | 140 | 0.7 | 24 |
| COMPARISON EXAMPLES | E | 1 | 120 | 120 | 10 | 0.15 | 12.0 |
|  |  | 2 |  |  | 110 | 0.10 | 10.5 |
|  | F | 1 | 100 | 100 | 10 | 0.005 | 4.8 |
|  |  | 2 |  |  | 90 | 0.003 | 4.2 |
|  | G | 1 | 130 | 130 | 10 | 0.008 | 5.2 |
|  |  | 2 |  |  | 120 | 0.005 | 4.5 |
|  | H | 1 | 45 | 95 | 12 | 0.4 | 17.0 |
|  |  | 2 | 50 |  | 90 | 0.01 | 6.8 |
|  | I | 1 | 120 | 120 | 10 | 0.001 | 2.8 |
|  |  | 2 |  |  | 110 | 0.0009 | 2.8 |
|  | J | 1 | 150 | 150 | 10 | 0.12 | 18.0 |
|  |  | 2 |  |  | 140 | 0.12 | 18.0 |

The samples A to D are embodiments of this invention. The sample E to H are comparison examples which have no partial layers, because the material gas had not been changed stepwise as shown in Table 1. The sample I is a natural diamond II a fixed on a tool as a comparison sample for the Raman scattering spectroscopy.

The sample J is another comparison sample. This is a sintered diamond which was made by sintering the diamond polycrystalline powder of 10 μm in average diameter including cobalt (Co) of 10 volume % under high pressure. The sample J was not made by the CVD methods. Since the sample J is a cutting chip with a sintered diamond fitted to the tool, it includes high density of the non-diamond ingredients uniformly.

The observation points are defined by the distance z (μm) from the rake surface as shown in FIG. 4. The layers 1 and 2 are the partial layers caused by changing the components or component ratio in the material gas. Since the side which had deposited at the beginning of the growth was assigned to be a rake surface, the steps 1 and 2 in Table 1 correspond to the layers 1 and 2 respectively. As a matter of course, the ratio (X/Y) is smaller near the rake surface in the embodiments. This means that the non-diamond density near the rake surface is lower than that near the fixation surface.

Since the comparison example E synthesized the diamond plate uniformly with the material gas having high density of carbon, the diamond plate of the sample E includes high density of the non-diamond ingredients. But the distribution of the non-diamond density is contradictory to that of this invention.

Since another comparison example F synthesized the diamond plate with the material gas having low density of carbon, the diamond plate of the sample F includes little density of the non-diamond ingredients. But the distribution of the non-diamond density is also contrary to that of this invention.

The comparison example H changed the density of diamond in the material gas stepwise in contradiction to the teaching of this invention in the CVD growth. The grown diamond has also the contradictory distribution to this invention regarding the non-diamond ingredients and the half width of the peak in the Raman scattering spectrum.

All the embodiments A to D increased the density of carbon in the material gas. In accordance with the treatment, in the grown diamond plate, the distribution of the non-diamond ingredients and the half width of the diamond peak in the Raman scattering spectrums increases along the direction of growth i.e. the direction from the rake surface to the fixation surface.

Performance test was done for the diamond tools under the conditions. The object to be cut is a round bar with four axial grooves made from A 390 alloy (Al - 17% Si).

speed for cutting: 800 m/min
depth of cutting: 0.2 mm
feed: 0.1 mm/rev.

Since abrasion loss is an important parameter for the performance test, average abrasion losses in 90 minute cutting or in 30 minute cutting were measured. Table 3 shows the result of the performance test.

TABLE 3

CUTTING PERFORMANCE OF THE DIAMOND SYNTHESIZED BY FILAMENT CVD METHOD

| | SAMPLE | $V_b$ ABRASION LOSS (μm) | |
|---|---|---|---|
| EMBODIMENTS | A | average abrasion loss in 90 minute cutting | 18 μm |
| | B | average abration loss in 90 minute cutting | 20 μm |
| | C | average abration loss in 90 minute cutting | 19 μm |
| | D | average abration loss in 90 minute cutting | 21 μm |
| COMPARISON EXAMPLES | E | average abrasion loss in 1 minute cutting | 105 μm |
| | F | 1 minute cutting, breakdown by chipping | |
| | G | 3 minute cutting, breakdown by chipping | |
| | H | average abration loss in 1 minute cutting | 150 μm |
| | I | 1 minute cutting, breakdown by chipping | |
| | J | average abrasion loss in 90 minute cutting | 90 μm |

From Table 2 and Table 3, all embodiments A to D exhibit high cutting performance without breakdown in the A390 cutting test. They all have the diamond in which the ratio ($X_1/Y_1$) of the peak height $X_1$ of the non-diamond ingredient to the peak height $Y_1$ of diamond in the Raman scattering spectrum near the rake surface is smaller than the ratio ($X_2/Y_2$) of the peak height $X_2$ to the peak height $Y_2$ near the fixation surface, or in which the half width ($\alpha cm^{-1}$) of the peak of diamond in the Raman scattering spectrum near the rake surface is smaller than the half width ($\beta cm^{-1}$) of the peak of diamond near the fixation surface i.e. $X_1/Y_1 < X_2/Y_2$ or $\alpha < \beta$.

On the contrary, the comparison examples E to J, in which $X_1/Y_1 \geq X_2/Y_2$ or $\alpha \geq \beta$, were broken down or worn out seriously in a short time.

Another comparison example J i.e. sintered diamond, was not broken down. But the average abrasion loss in 90 minute cutting was 90 μm, which is far larger than that of the embodiments. Since the sintered sample J contains the binder, e.g. cobalt (Co), the binder would lower the abrasion resistance.

The comparison example E, which includes uniformly high density of the non-diamond ingredients or reveals a wide half width of the diamond peak (more than 10 $cm^{-1}$), is far inferior in the abrasion resistance to all the embodiments.

The comparison example H, which has high non-diamond density and wide half width near the rake surface, is also inferior in the abrasion resistance.

Otherwise, the comparison example F, which has little non-diamond ingredients and narrow half width (less than 6 $cm^{-1}$) overall, lacks toughness and chipping resistance. Especially, the sample E is likely to be broken down for a hard object to be cut.

As mentioned many times, the diamond plate of this invention has better quality near the rake surface and worse quality near the fixation surface. Non-uniformity of quality is the essential feature of this invention. The diamond near the fixation surface with adequate elasticity alleviates the strong force acting on the rake surface and heightens the chipping resistance overall.

This invention has been defined so far by the defect concentration, the non-diamond density, the peak heights and the half width of the peak in the Raman scattering spectrum. However, since the invention requires only the non-uniformity of quality between the rake surface and the fixation surface, it can be defined otherwise by other physical observable parameters, e.g.

Young's modulus, intensity of cathode luminescence, size of crystal granules and hydrogen density. The properties of the rake surface and the fixation surface are defined by these parameters as follows.

|  | RAKE SURFACE | FIXATION SURFACE |
|---|---|---|
| YOUNG'S MODULUS | higher | lower |
| CATHODE (440 nm) LUMINESCENCE | weaker | stronger |
| SIZE OF CRYSTAL | smaller | larger |
| HYDROGEN DENSITY | lower | higher |

EMBODIMENT ②

Microwave Plasma CVD Method

Figure 8:
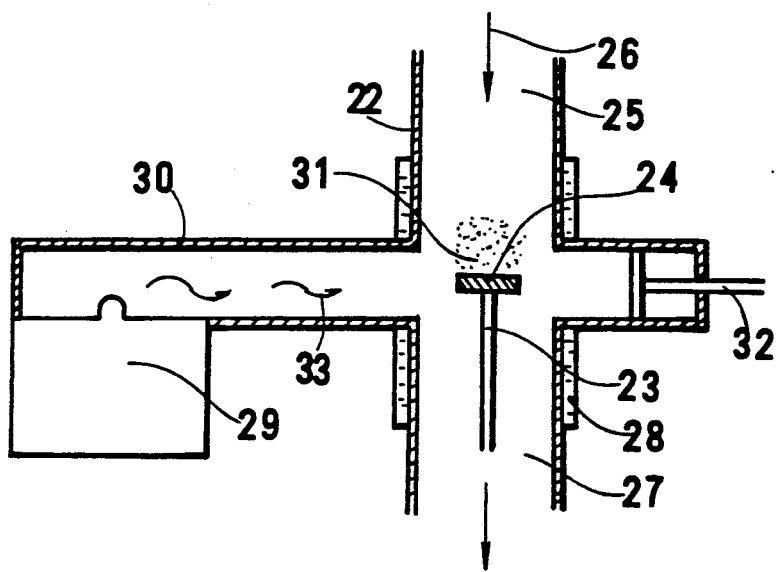
FIG. 8 is a schematical sectional view of a microwave plasma CVD apparatus.

Second, this invention was applied to the microwave plasma CVD method. FIG. 8 shows the apparatus. In a quartz cylinder (22), a quartz bar (23) supports a substrate (24) on its top end. From a gas inlet above (25), material gas (26) is introduced into the quartz cylinder (22). Exhaust gas is exhaled from a gas outlet (27) below. A cooling water jacket (28) is equipped around the reaction region of the quartz cylinder (22). A magnetron (29) generates microwave (33). The microwave (33) propagates through a waveguide (30) to the vicinity of the substrate (24). The microwave excites the material gas to plasma or neutral radicals. High density of plasma is generated around the substrate (24).

In this embodiment, the waveguide is at right angles to the quartz cylinder and the microwave propagates at right angles to the quartz cylinder. However, another geometric relations between the waveguide and the guartz cylinder can be chosen as long as high density plasma is induced by the microwave oscillation. The shape and the size of the waveguide determine the mode of microwave. A plunger (32) carrying a reflector can displace in the waveguide (30). Since the frequency of the microwave is predetermined (e.g. 2.45 GHz), the mode of the standing wave is uniquely determined by the position of the plunger. The microwave CVD apparatus belongs to state of arts.

Like embodiment 1, the material gas comprises carbon containing gas and hydrogen gas. Preferably magnets are furnished around the quartz cylinder for generating the cusp magnetic field or the axial magnetic field for confining the plasma within a small space near the substrate.

Table 4 shows the conditions for synthesizing diamond by the microwave plasma CVD method. The substrates were polycrystalline silicon plates. The temperature of the substrate was monitored by the optical thermometer.

TABLE 4

CONDITIONS FOR SYNTHESIZING DIAMOND BY MICROWAVE PLASMA CVD METHOD

| sample | step | material gas (sccm) | hour | pressure |
|---|---|---|---|---|
| K | 1 | $H_2$ 200 Ar 100 $CH_4$ 4.5 $H_2O$ 2.5 | 30 | 120 |
|  | 2 | $H_2$ 200 Ar 100 $CH_4$ 8 | 25 | 80 |
| L | 1 | $H_2$ 200 Ar 100 $CH_4$ 2.0 | 38 | 100 |
|  | 2 | $H_2$ 200 Ar 100 $CH_4$ 10 | 20 | 110 |
| M | 1 | $H_2$ 400 Ar 100 $CH_4$ 8 $H_2O$ 4 | 5 | 80 |
|  | 2 | $H_2$ 200 $CH_4$ 6 | 12 | 40 |
|  | 3 | $H_2$ 200 $CH_4$ 10 | 8 | 50 |
|  | 4 | $H_2$ 200 Ar 100 $N_2$ 2 $CH_4$ 6 | 25 | 100 |
| N | 1 | $H_2$ 200 $CH_4$ 2 | 100 | 40 |
|  | 2 | $H_2$ 200 $CH_4$ 6 | 80 | 40 |
| O | 1 | $H_2$ 200 $CH_4$ 2 | 250 | 40 |
| P | 1 | $H_2$ 200 $CH_4$ 10 | 180 | 55 |
| Q | 1 | $H_2$ 200 $CH_4$ 8 | 85 | 45 |
|  | 2 | $H_2$ 200 $CH_4$ 4 $H_2O$ 0.5 | 200 | 30 |

Samples K to N are embodiments of this invention. These embodiments changed the components or the component ratio of material gas in two steps or four steps to increase the density of carbon in later steps. Rare gas, e.g. Ar was added to excite the microwave plasma stably and to increase the density of active radicals, e.g. Haand $C_2$.

Samples O to Q are comparison examples. The sample O was synthesized overall by the material gas with low density of carbon. The same P was synthesized overall by the material gas with high density of carbon. The sample Q changed the component ratio of material gas in contradiction to this invention.

Like embodiment 1, the diamond plates were cut into four triangles. Cutting chips were made by fitting the diamond plates on tools. The Raman scattering measurements were done on the tools. Table 5 shows the results of the measurements.

TABLE 5

RAMAN SCATTERING EXPERIMENT OF THE DIAMOND SYNTHESIZED BY MICROWAVE PLASMA CVD METHOD

|  | sample | layer | thickness of layers | total thickness | observation point | X/Y | half width of the peak |
|---|---|---|---|---|---|---|---|
| EMBODIMENTS | K | 1 | 60 | 120 | 7 | 0.003 | 3.8 |
|  |  | 2 | 60 |  | 115 | 0.010 | 9.8 |
|  | L | 1 | 40 | 90 | 5 | 0.005 | 4.2 |
|  |  | 2 | 50 |  | 84 | 0.015 | 10.1 |
|  | M | 1 | 15 | 107 | 7 | 0.004 | 4.5 |
|  |  | 2 | 10 |  | 20 | 0.008 | 9.0 |
|  |  | 3 | 12 |  | 30 | 0.2 | 12.5 |
|  |  | 4 | 70 |  | 100 | 0.25 | 19.5 |
|  | N | 1 | 78 | 168 | 10 | 0.009 | 5.1 |
|  |  | 2 | 90 |  | 150 | 0.15 | 10.1 |
| COMPARISON EXAMPLES | O | 1 | 120 | 120 | 10 | 0.09 | 5.8 |
|  |  | 2 |  |  | 110 | 0.04 | 5.0 |
|  | P | 1 | 100 | 100 | 10 | 0.7 | 19.4 |
|  |  | 2 |  |  | 90 | 0.5 | 23.5 |
|  | Q | 1 | 130 | 130 | 10 | 0.55 | 18.7 |
|  |  | 2 |  |  | 120 | 0.01 | 8.2 |

Under the same conditions as the embodiment 1, the diamond tools were estimated by the cutting performance test. Table 6 shows the results of the cutting performance test.

TABLE 6
CUTTING PERFORMANCE OF THE DIAMOND SYNTHESIZED BY MICROWAVE PLASMA CVD METHOD

| | SAMPLE | $V_b$ ABRASION LOSS ($\mu$m) | |
|---|---|---|---|
| EMBODIMENTS | K | average abrasion loss in 90 minute cutting | 21 $\mu$m |
| | L | average abration loss in 90 minute cutting | 18 $\mu$m |
| | M | average abration loss in 90 minute cutting | 20 $\mu$m |
| | N | average abration loss in 90 minute cutting | 22 $\mu$m |
| COMPARISON EXSAMPLES | O | 1 minute cutting, breakdown by chipping | |
| | P | average abration loss in 1 minute cutting | 150 $\mu$m |
| | Q | 3 minute cutting, breakdown by chipping | |

From Table 5 and Table 6, all embodiments K to N exhibits high cutting performance without breakdown in the A390 cutting test. They all have the diamond in which the ratio ($X_1/Y_1$) of the peak height $X_1$ of the non-diamond ingredient to the peak height $Y_1$ of diamond in the Raman scattering spectrum near the rake surface is smaller than the ratio ($X_2/Y_2$) of the peak height $X_2$ to the peak height $Y_2$ near the fixation surface, or in which the half width ($\alpha$ cm$^{-1}$) of the peak of diamond in the Raman scattering spectrum near the rake surface is smaller than the half width ($\beta$ cm$^{-1}$) of the peak of diamond near the fixation surface i.e. $X_1/Y_1 < X_2/Y_2$ or $\alpha < \beta$.

On the contrary, the comparision examples O to Q, in which $X_1/Y_1 \geq X_2/Y_2$ or $\alpha \geq \beta$, were broken down or worn out seriously in a short time.

EMBODIMENT ③

Filament CVD and Heat-exciting CVD

The quality of diamond must be changed at least in two steps in this invention. Different CVD methods can be applied to the different steps. Here the first step of deposition was procesed by the filament CVD method and the second step was processed by the heat-exciting CVD method.

Figure 9:
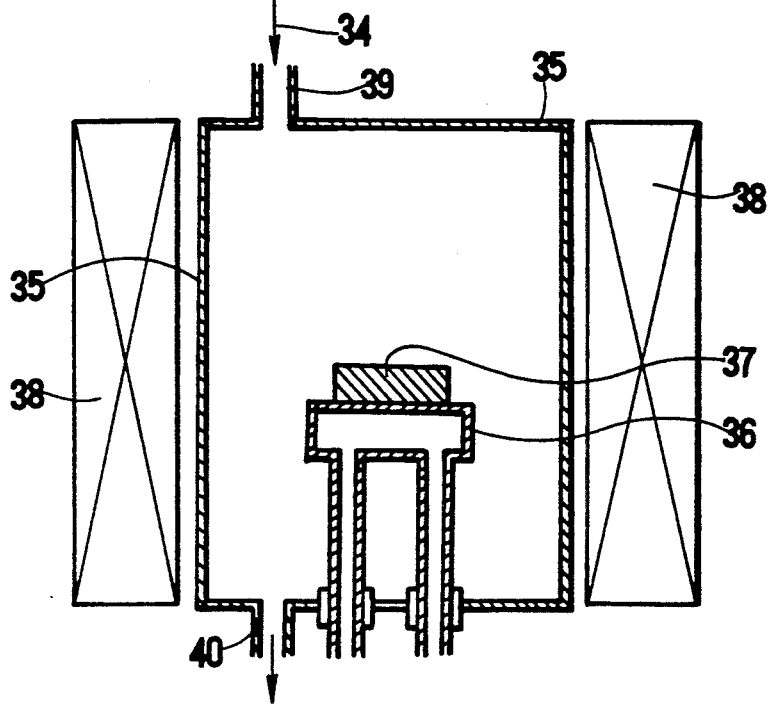
FIG. 9 is a schematical sectional view of a heat-exciting CVD apparatus.
Figure 10:
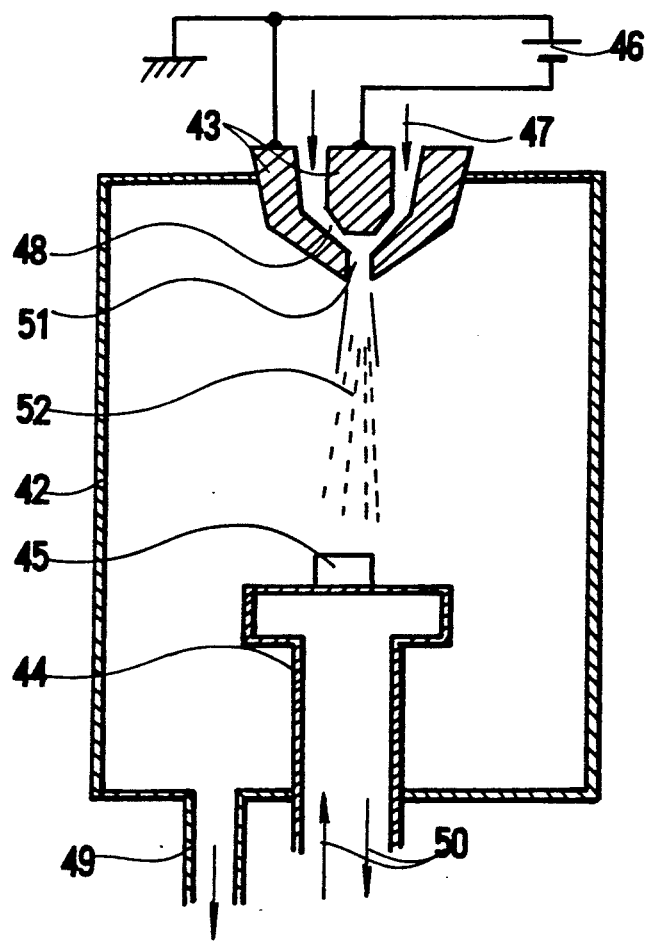
FIG. 10 is a schematic sectional view of a heat plasma CVD apparatus.

FIG. 9 shows the heat-exciting CVD apparatus. A quartz chamber (35) is a chamber which can be made vacuous. A susceptor (36) stands in the quartz chamber (35). A substrate (37) is mounted on the susceptor (36). A heater (38) is furnished around the quartz chamber (35). Material gas is inhaled through a gas inlet (39) into the quartz chamber (35). Exhaust gas is exhaled through a gas outlet (40). Since the material gas is excited by heat, polycrystalline diamond is deposited on the substrate, being synthesized by the vapor phase chemical reaction. Preferably the gas containing fluorine shall be added in the material gas in order to synthesize diamond at low temperature by the heat-excited CVD method.

The substrate is a polycrystalline silicon plate of 14 mm × 14 mm × 0.25 mm.

| (First step) conditions . . . filament CVD method | | |
|---|---|---|
| material gas | H$_2$ | 1000 sccm |
| | C$_2$H$_5$OH | 20 sccm |
| pressure | | 100 Torr |
| substrate temperature | | 880° C. |

| -continued | | |
|---|---|---|
| thickness | | 80 $\mu$m |
| (Second step) conditions (following 1 step) . . . heat-exciting CVD method | | |
| material gas | H$_2$ | 1000 sccm |
| | CH$_3$Br | 30 sccm |
| | F$_2$ | 18 sccm |
| | He | 150 sccm |
| pressure | | 100 Torr |
| substrate temperature | | 200° C. |
| thickness | | 100 $\mu$m |

By the first step (filament CVD) and the second step (heat-exciting CVD) of the deposition, a diamond layer of 180 $\mu$m in thickness was obtained. A tool was made by brazing the metalized and divided diamond plate on a cemented carbide tool body according to the processes shown in FIG. 2.

The Raman scattering measurement was carried out to the diamond plate. The ratios (X/Y) of the peak heigh (X) of the non-diamond ingredients to the peak height (Y) of diamond and the half widths $\alpha$ and $\beta$ for the first and the second layers are, first layer: (at the point of 10 $\mu$m distanced from the rake surface)

$$X_1/Y_1 = 0.005$$

$$\alpha = 4.5 \text{ cm}^{-1}$$

second layer: (at the point of 165 $\mu$m distanced from the rake surface)

$$X_2/Y_2 = 0.3$$

$$\beta = 18.8 \text{ cm}^{-1}$$

The ratio (X/Y) and the half width were bigger in the second layer made by the material gas with higher density of carbon at lower temperature.

To estimate the cutting performance, a round bar of A390 alloy (Al-17% Si) with four axial grooves was cut by this diamond tool under the same conditions as the embodiments 1 and 2, speed for cutting: 800 mm/min
depth of cutting: 0.2 mm
feed: 0.1 mm/rev.

The $V_b$ abrasion loss in 120 minute cutting was 15 $\mu$m. This result shows that this invention is also applicable to the heat-exciting CVD method.

EMBODIMENT ④

Heat Plasma CVD Method

FIG. 10 shows the heat plasma CVD apparatus. On an upper wall of a vacuum chamber (42), coaxial electrodes (43) is equipped. A susceptor (44) is installed below the electrodes (43). A substrate (45) is mounted on the susceptor (44). The inner electrode is a cathode and the outer electrode is an anode. Some voltage is applied between the anode and the cathode by the direct current power source (46).

Passing through the gap between the anode and the cathode, material gas (47) is inhaled into the vacuum chamber (42) via a nozzle (51). Being ionized to plasma gas by the action of discharge between the electrodes (43), the material gas (47) flows toward the substrate (45). Exhaust gas is exhaled from the gas outlet (49) to a vacuum pump (not shown in the figures).

The substrate is a silicon polycrystal plate of 25 mm×25 mm×5.0 mm. In order to change the quality of diamond along the direction of thickness, diamond was grown in two steps.

| (first step) conditions for growth | | |
|---|---|---|
| material gas | $H_2$ | 10 slm |
| | $CH_4$ | 1.8 slm |
| | Ar | 30 slm |
| pressure | | 200 Torr |
| substrate temperature | | 400° C. |
| thickness of growth | | 500 µm |
| (second step) condition for growth | | |
| material gas | $H_2$ | 20 slm |
| | $CH_4$ | 5 slm |
| | He | 50 slm |
| pressure | | 100 Torr |
| substrate temperature | | 600° C. |
| thickness of growth | | 2400 µm | where "slm" (standard litter per minute) is a unit of gas flow. 1 slm means 1 l of gas reduced to the standard state i.e. at 0° C. under 1 atm flows per minute.

Total thickness of the diamond was 2900 µm (2.9 nm). According to the processes shown by FIG. 2, a diamond tool was made by brazing the diamond plate onto a tool body. The Raman scattering measurement was done to the first layer and the second layer.

The half-widths of the diamond peak were; (1) first layer at 30 µm depth from the rake surface $\alpha = 4.9$ cm$^{-1}$ (2) second layer at 2862 µm depth from the rake surface $\beta = 13.6$ cm$^{-1}$.

To estimate the cutting performance of the diamond tool, a round bar made of A390 alloy (Al-17% Si) with four axial grooves was cut by the diamond tool under the same conditions as the embodiments ①, ② and ③, without lubricant, cutting speed: 800 m/min
cutting depth: 0.2 mm
feed: 0.1 mm/rev.

The $V_b$ abrasion loss in 120 minute cutting was 31 µm. This is a very small loss. This result shows that this invention is also applicable to the heat plasma CVD method.

What we claim is:

1. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 µm in thickness and substantially consisting of crystalline diamond and non-diamond ingredients of carbon, wherein the density of the non-diamond ingredients increases along the direction of thickness from the rake surface to the fixation surface.

2. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 µm in thickness and substantially consisting of crystalline diamond and non-diamond ingredients of carbon, wherein the density of the non-diamond ingredients at a point distanced from the rake surface by a length less than the shorter of either 30% of the average thickness or 40 µm, is smaller than the density of the non-diamond ingredients at a point distanced from the fixation surface by a length less than the shorter of either 30% of the average thickness or 40 µm.

3. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 µm in thickness and substantially consisting of crystalline diamond and non-diamond ingredients of carbon, wherein the ratio ($X_1/Y_1$) of the peak height $X_1$ of the non-diamond ingredients to the peak height $Y_1$ of diamond in the Raman scattering spectrum at a point distanced from the rake surface by a length less than the shorter of either 30% of the average thickness or 40 µm, is smaller than the ratio ($X_2/Y_2$) of the peak height $X_2$ of the non-diamond ingredient to the peak height $Y_2$ of diamond at a point distanced from the fixation surface by a length less than the shorter of either 30% of the average thickness or 40 µm.

4. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 µm in thickness and substantially consisting of crystalline diamond and non-diamond ingredients of carbon, wherein the polycrystalline diamond includes defects and the concentration of defects near the rake surface is smaller than the concentration of defects near the fixation surface.

5. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 µm in thickness and substantially consisting of crystalline diamond and non-diamond ingredients of carbon, wherein the polycrystalline diamond includes defects and the concentration of defects at a point distanced from the rake surface by a length less than the shorter of either 30% of the average thickness or 40 µm, is smaller than the concentration of defects at a point distanced from the fixation surfaced by a length less than the shorter of either 30% of the average thickness or 40 µm.

6. A Polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 µm in thickness and substantially consisting of crystalline diamond and non-diamond ingredients of carbon, wherein the half width ($\alpha$ cm$^{-1}$) of the peak of diamond in the Raman scattering spectrum at a point distanced from the rake surface by a length less than the shorter of either 30% of the average thickness or 40 µm, is smaller than the half width ($\beta$ cm$^{-1}$) of the peak of diamond in the Raman scattering spectrum at a point distanced from the fixation surface by a length less than the shorter of either 30% of the average thickness or 40 µm.

7. A polycrystalline diamond tool as claimed in any of claims 1 through 6, wherein the polycrystalline diamond plate is brazed to the tool body.

8. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 $\mu$m in thickness and substantially consisting of crystalline diamond and non-diamond ingredients of carbon, wherein the Young's modulus of the diamond near the rake surface is higher than that of the diamond near the fixation surface.

9. A Polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 $\mu$m in thickness and substantially consisting of crystalline diamond and non-diamond ingredients of carbon, wherein cathode luminescence of the diamond near the rake surface is weaker than that of the diamond near the fixation surface.

10. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 $\mu$m in thickness and substantially consisting of crystalline diamond and non-diamond ingredients of carbon, wherein the granule size of the diamond polycrystal near the rake surface is smaller than that of the diamond polycrystal near the fixation surface.

11. A polycrystalline diamond tool comprising a tool body having an edge surface and a polycrystalline diamond plate having a rake surface and a fixation surface being fixed to the edge surface of the tool body, the polycrystalline diamond plate being more than 40 $\mu$m in thickness, characterized in that the density of hydrogen in the diamond near the rake surface is smaller than that in the diamond near the fixation surface.

12. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 $\mu$m in thickness and substantially consisting of crystalline diamond and non-diamond ingredients of carbon, wherein the density of the non-diamond ingredients at a point distanced from the rake surface by a length less than 30% of the average thickness is smaller than the density of the non-diamond ingredients at a point distanced from the fixation surface by a length less than 30% of the average thickness.

13. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more that 40 $\mu$m in thickness and substantially consisting of crystalline diamond and non-diamond ingredients of carbon, wherein the ratio ($X_1/Y_1$) of the peak height $X_1$ of the non-diamond ingredients to the peak height $Y_1$ of diamond in the Raman scattering spectrum at a point distanced from the rake surface by a length less than 30% of the average thickness, is smaller than the ratio ($X_2/Y_2$) of the peak height $X_2$ of the non-diamond ingredient to the peak height $Y_2$ of diamond at a point distanced from the fixation surface by a length less than 30% of the average thickness.

14. A polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 $\mu$m in thickness and substantially consisting of crystalline diamond and non-diamond ingredients of carbon, wherein the polycrystalline diamond includes defects and the concentration of defects at a point distanced from the rake surface by a length less than 30% of the average thickness, is smaller than the concentration of defects at a point distanced from the fixation surfaced by a length less than 30% of the average thickness.

15. A Polycrystalline diamond tool comprising:
a tool body having an edge surface; and
a polycrystalline diamond plate having a rake surface and a fixation surface, the fixation surface being fixed to the edge surface of the tool body, the polycrystalline diamond plate being more than 40 $\mu$m in thickness and substantially consisting of crystalline diamond and non-diamond ingredients of carbon, wherein the half width ($\alpha$ cm$^{-1}$) of the peak of diamond in the Raman scattering spectrum at a point distanced from the rake surface by a length less than 30% of the average thickness, is smaller than the half width ($\beta$ cm$^{-1}$) of the peak of diamond in the Raman scattering spectrum at a point distanced from the fixation surface by a length less than 30% of the average thickness.

* * * * *